United States Patent
Zhou et al.

(10) Patent No.: US 9,595,451 B1
(45) Date of Patent: Mar. 14, 2017

(54) HIGHLY SELECTIVE ETCHING METHODS FOR ETCHING DIELECTRIC MATERIALS

(71) Applicant: Applied Materials, Inc., Santa Clara, CA (US)

(72) Inventors: Hailong Zhou, San Jose, CA (US); Gene Lee, San Jose, CA (US); Liming Yang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/887,254

(22) Filed: Oct. 19, 2015

(51) Int. Cl.
*H01L 21/311* (2006.01)
*H01L 21/02* (2006.01)

(52) U.S. Cl.
CPC .... *H01L 21/31116* (2013.01); *H01L 21/0214* (2013.01); *H01L 21/0217* (2013.01); *H01L 21/02164* (2013.01); *H01L 21/02271* (2013.01)

(58) Field of Classification Search
None
See application file for complete search history.

(56) References Cited

U.S. PATENT DOCUMENTS

| | | | |
|---|---|---|---|
| 6,014,979 A * | 1/2000 | Van Autryve | B08B 7/0035 134/1.1 |
| 6,916,746 B1 | 7/2005 | Hudson et al. | |
| 7,056,830 B2 * | 6/2006 | Merry | H01L 21/0332 257/E21.035 |
| 7,294,580 B2 | 11/2007 | Yun et al. | |
| 7,683,447 B2 | 3/2010 | Wang et al. | |
| 7,767,977 B1 | 8/2010 | Godet et al. | |
| 7,888,653 B2 | 2/2011 | Kellerman et al. | |
| 7,910,489 B2 | 3/2011 | Kim et al. | |
| 8,101,510 B2 | 1/2012 | Godet et al. | |
| 2004/0072430 A1 * | 4/2004 | Huang | H01L 21/31116 438/689 |
| 2007/0004215 A1 * | 1/2007 | Mrvos | B81C 1/00531 438/712 |
| 2010/0267241 A1 * | 10/2010 | Riva | B81C 1/00531 438/706 |
| 2012/0135273 A1 | 5/2012 | Horng et al. | |
| 2012/0135543 A1 | 5/2012 | Shin et al. | |
| 2012/0270404 A1 * | 10/2012 | Bajaj | H01L 21/76898 438/700 |
| 2014/0038311 A1 | 2/2014 | Kim et al. | |
| 2014/0070376 A1 * | 3/2014 | Hess | H01L 21/30655 257/632 |

(Continued)

*Primary Examiner* — Shamim Ahmed
(74) *Attorney, Agent, or Firm* — Patterson + Sheridan, LLP

(57) ABSTRACT

Methods for forming high aspect ratio features using an etch process are provided. In one embodiment, a method for etching a dielectric layer to form features in the dielectric layer includes (a) supplying an etching gas mixture during a first mode to etch a portion of a dielectric layer disposed on a substrate while forming a passivation protection in the dielectric layer, wherein the dielectric layer is etched through openings defined in a patterned mask layer disposed on the dielectric layer, (b) supplying an etching gas mixture during a second mode to continue forming the passivation protection in the dielectric layer without etching the dielectric layer, and repeatedly performing (a) and (b) to form features in the dielectric layer until a surface of the substrate is exposed.

19 Claims, 3 Drawing Sheets

(56) References Cited

U.S. PATENT DOCUMENTS

2014/0134846 A1* 5/2014 Hirayama ......... H01J 37/32082
 438/703
2015/0011088 A1* 1/2015 McNie .................... C23C 16/52
 438/689

* cited by examiner

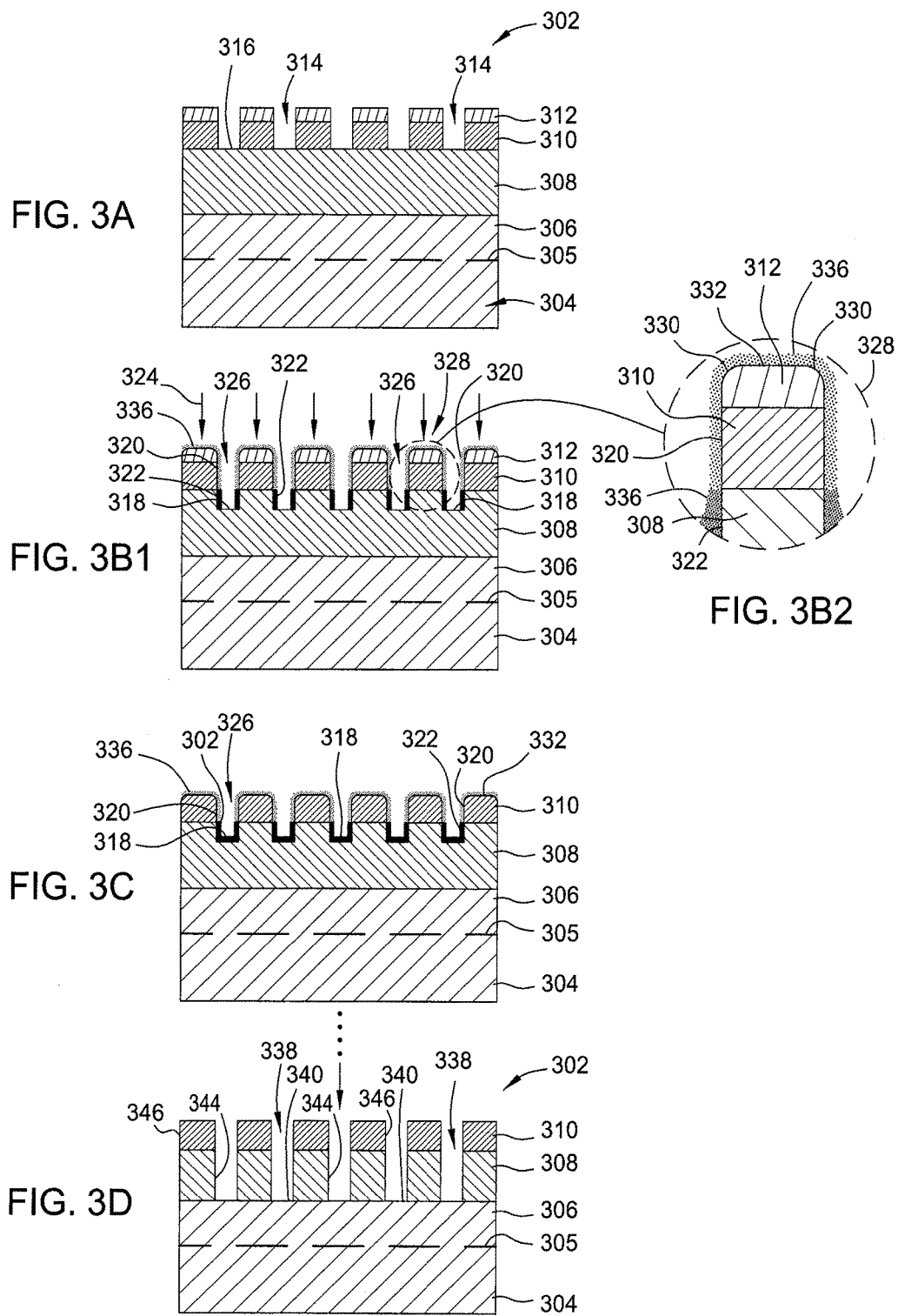

HIGHLY SELECTIVE ETCHING METHODS FOR ETCHING DIELECTRIC MATERIALS

BACKGROUND OF THE DISCLOSURE

Field

The embodiments herein generally relate to an etching process for etching a dielectric layer with high selectivity.

Description of the Background Art

Reliably producing submicron and smaller features is one of the key requirements of very large scale integration (VLSI) and ultra large scale integration (ULSI) of semiconductor devices. However, with the continued miniaturization of circuit technology, the dimensions of the size and pitch of circuit features, such as interconnects, have placed additional demands on processing capabilities. The multilevel interconnects that lie at the heart of this technology require precise imaging and placement of high aspect ratio features, such as vias and other interconnects. Reliable formation of these interconnects is critical to further increases in device and interconnect density. Additionally, forming sub-micron size features and interconnects with reduced waste of intermediate materials, such as resists and hardmask materials, is desired.

As feature sizes have become smaller, the demand for higher aspect ratios, defined as the ratio between the depth of the feature and the width of the feature, has steadily increased to 20:1 and even greater. Developing etch processes that are capable of reliably forming features with such high aspect ratios presents a significant challenge. Traditionally, features in a material layer having aspect ratios of about 10:1 or so were fabricated by anisotropically etching dielectric layers to a predetermined depth and width.

During etching, redeposition or build-up of by-products or other materials generated during the etching process may accumulate on the top and/or sidewalls of the features being etched, thereby blocking the opening of the feature being formed in the material layer. As the opening of the etched features are narrowed and/or sealed by the accumulated redeposition material, the reactive etchants are prevented from reaching the lower surface of the features, thereby limiting the aspect ratio that may be obtained. Additionally, as the redeposition material or build-up of by-products may be randomly and/or irregularly adhere to the top surface and/or sidewalls of the features being etched, the resulting irregular profile and growth of the redeposition material may alter the flow path of the reactive etchants, thereby resulting in a bowing or twisting profile of the features formed in the material layer.

Furthermore, in some cases, after the etching process, the corners features often suffer from rounded top shoulder erosion or undesired non-vertical sidewall etched profile, resulting in critical dimension (CD) loss or deformed profiles. In accurate profile or structural dimensions may result in collapse of the device structure, eventually leading to device failure and product low yield. Poor etching selectivity and control occurring during manufacturing processes for such shapes or features in the material layer may undesirably result in an inaccurate profile control, thereby eventually leading to device failure.

Therefore, there is a need in the art for improved methods for etching features with high aspect ratios.

SUMMARY

Methods for forming high aspect ratio features using an etch process are provided. The methods described herein advantageously facilitate profile and dimension control of features with high aspect ratios through a proper sidewall and bottom management scheme during the feature etching process.

In one embodiment, a method for etching a dielectric layer to form features in the dielectric layer includes (a) supplying an etching gas mixture during a first mode to etch a portion of a dielectric layer disposed on a substrate while forming a passivation protection in the dielectric layer, wherein the dielectric layer is etched through openings defined in a patterned mask layer disposed on the dielectric layer, (b) supplying an etching gas mixture during a second mode to continue forming the passivation protection in the dielectric layer without etching the dielectric layer, and repeatedly performing (a) and (b) to form features in the dielectric layer until a surface of the substrate is exposed.

In another embodiment, a method for etching a dielectric layer to form features in the dielectric layer includes (a) performing a plasma process to etch a dielectric layer disposed on a substrate during a first mode to form features in the dielectric layer while forming a passivation protection predominately on corners and sidewalls of the features formed in the dielectric layer, and (b) continuously performing the plasma process during a second mode to dominantly form the passivation protection on the corners, sidewalls and bottom of the features formed in the dielectric layer without etching the dielectric layer.

In yet another embodiment, a method for etching a dielectric layer to form features in the dielectric layer includes (a) performing a plasma process to etch a dielectric layer disposed on a substrate during a first mode to form features in the dielectric layer while forming a passivation protection predominately on corners and sidewalls of the features in the dielectric layer, (b) continuously performing the plasma process during a second mode to dominantly form the passivation protection on the corners, sidewalls and bottom of the features in the dielectric layer without etching the dielectric layer, a reacting gas and a silicon containing gas included in the plasma process in the first mode supplied at a greater flow rate than the reacting gas and the silicon containing gas in the second mode, and (c) repeating (a) and (b) until a surface of the substrate is exposed.

BRIEF DESCRIPTION OF THE DRAWINGS

So that the manner in which the above recited features of the embodiments herein are attained and can be understood in detail, a more particular description of the disclosure, briefly summarized above, may be had by reference to the examples thereof which are illustrated in the appended drawings.

FIGS. 3A-3D depict a film stack at various stages during a etching process to etch a dielectric layer in a substrate utilizing the process depicted in FIG. 2.

Figure 1:
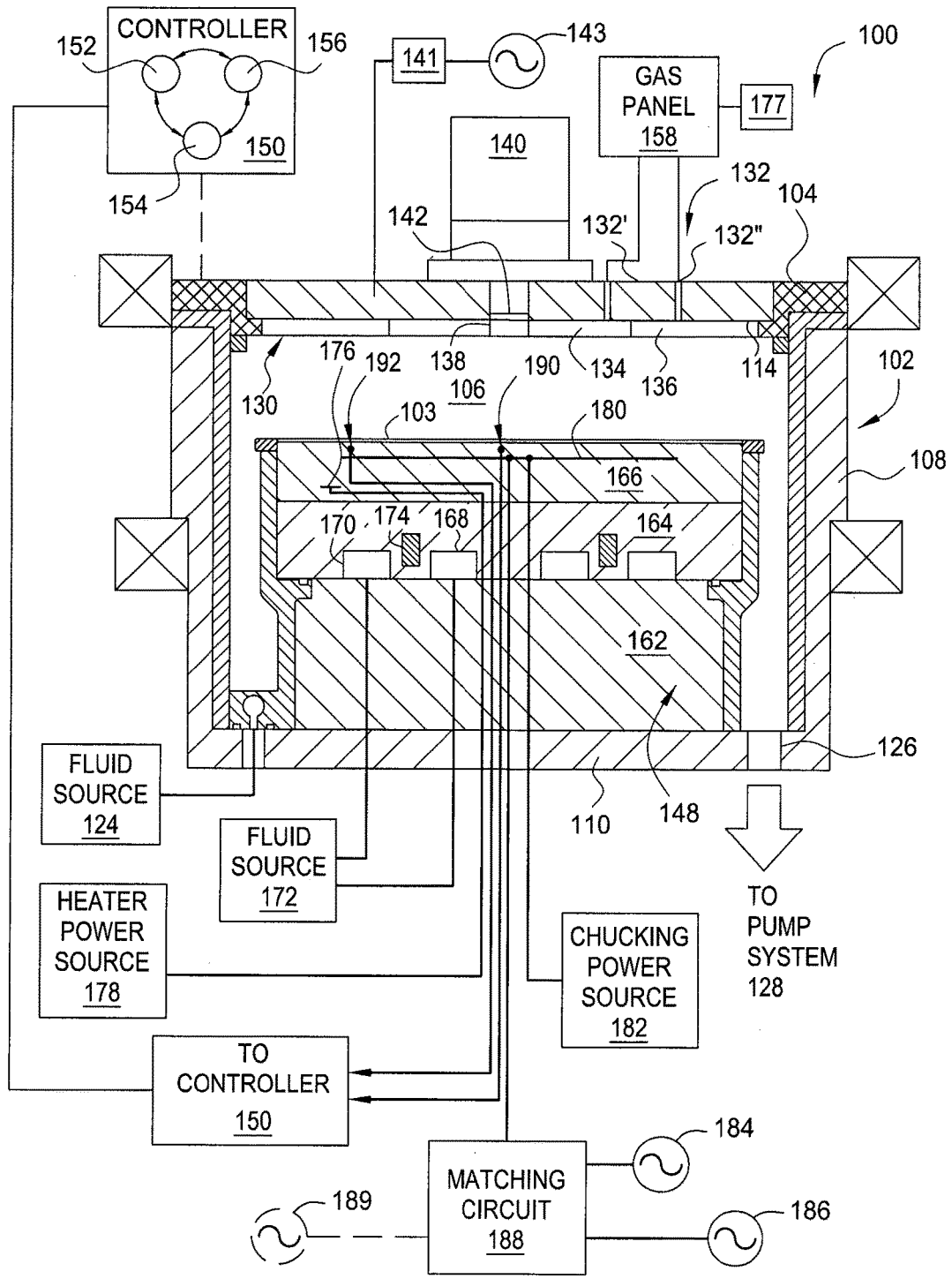
FIG. 1 depicts a processing chamber that may be utilized to form a dielectric layer.

To facilitate understanding of the embodiments, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary examples and are therefore not to be considered limiting of its scope, for the invention may admit to other equally effective embodiments.

DETAILED DESCRIPTION

Embodiments for the present application includes methods for forming features having high aspect ratios using an etch process. In one embodiment, the method includes plasma etching a dielectric layer using different operating modes, such as using different process parameters during the different modes, to achieve different etching profile management. For example, the etching process may include a first mode that may etch a dielectric layer with good sidewall and top surface protection management. The etching process may further include a second mode that may provide particularly good bottom as well as sidewall protection management during the etching process. The good bottom as well as sidewall protection during the etching process may assist etching the dielectric layer down to the bottom of the dielectric layer, forming features with desired high aspect ratios while retaining good profile control and critical dimensions.

FIG. 1 is a sectional view of one example of a processing chamber 100 suitable for performing a patterning process to etch a planarization layer along with a hardmask layer on a substrate using an etching process. Suitable processing chambers that may be adapted for use with the teachings disclosed herein include, for example, an ENABLER® or C3® processing chamber available from Applied Materials, Inc. of Santa Clara, Calif. Although the processing chamber 100 is shown including a plurality of features that enable superior etching performance, it is contemplated that other processing chambers may be adapted to benefit from one or more of the inventive features disclosed herein.

The processing chamber 100 includes a chamber body 102 and a lid 104 which enclose an interior volume 106. The chamber body 102 is typically fabricated from aluminum, stainless steel or other suitable material. The chamber body 102 generally includes sidewalls 108 and a bottom 110. A substrate support pedestal access port (not shown) is generally defined in a sidewall 108 and a selectively sealed by a slit valve to facilitate entry and egress of a substrate 100 from the processing chamber 100. An exhaust port 126 is defined in the chamber body 102 and couples the interior volume 106 to a pump system 128. The pump system 128 generally includes one or more pumps and throttle valves utilized to evacuate and regulate the pressure of the interior volume 106 of the processing chamber 100. In one implementation, the pump system 128 maintains the pressure inside the interior volume 106 at operating pressures typically between about 10 mTorr to about 500 Torr.

The lid 104 is sealingly supported on the sidewall 108 of the chamber body 102. The lid 104 may be opened to allow excess to the interior volume 106 of the processing chamber 100. The lid 104 includes a window 142 that facilitates optical process monitoring. In one implementation, the window 142 is comprised of quartz or other suitable material that is transmissive to a signal utilized by an optical monitoring system 140 mounted outside the processing chamber 100.

The optical monitoring system 140 is positioned to view at least one of the interior volume 106 of the chamber body 102 and/or the substrate 103 positioned on a substrate support pedestal assembly 148 through the window 142. In one embodiment, the optical monitoring system 140 is coupled to the lid 104 and facilitates an integrated deposition process that uses optical metrology to provide information that enables process adjustment to compensate for incoming substrate pattern feature inconsistencies (such as thickness, and the like), provide process state monitoring (such as plasma monitoring, temperature monitoring, and the like) as needed. One optical monitoring system that may be adapted to benefit from the invention is the EyeD® full-spectrum, interferometric metrology module, available from Applied Materials, Inc., of Santa Clara, Calif.

A gas panel 158 is coupled to the processing chamber 100 to provide process and/or cleaning gases to the interior volume 106. In the example depicted in FIG. 1, inlet ports 132', 132" are provided in the lid 104 to allow gases to be delivered from the gas panel 158 to the interior volume 106 of the processing chamber 100. In one implementation, the gas panel 158 is adapted to provide fluorinated process gas through the inlet ports 132', 132" and into the interior volume 106 of the processing chamber 100. In one implementation, the process gas provided from the gas panel 158 includes at least a fluorinated gas, chlorine, and a carbon containing gas, an oxygen gas, a nitrogen containing gas and a chlorine containing gas. Examples of fluorinated and carbon containing gases include $CHF_3$, $CH_2F_2$ and $CF_4$. Other fluorinated gases may include one or more of $C_2F$, $C_4F_6$, $C_3F_8$ and $C_5F_8$. Examples of the oxygen containing gas include $O_2$, $CO_2$, $CO$, $N_2O$, $NO_2$, $O_3$, $H_2O$, and the like. Examples of the nitrogen containing gas include $N_2$, $NH_3$, $N_2O$, $NO_2$ and the like. Examples of the chlorine containing gas include $HCl$, $Cl_2$, $CCl_4$, $CHCl_3$, $CH_2Cl_2$, $CH_3Cl$, and the like. Suitable examples of the carbon containing gas include methane ($CH_4$), ethane ($C_2H_6$), ethylene ($C_2H_4$), and the like.

A showerhead assembly 130 is coupled to an interior surface 114 of the lid 104. The showerhead assembly 130 includes a plurality of apertures that allow the gases flowing through the showerhead assembly 130 from the inlet ports 132', 132" into the interior volume 106 of the processing chamber 100 in a predefined distribution across the surface of the substrate 103 being processed in the processing chamber 100.

A remote plasma source 177 may be optionally coupled to the gas panel 158 to facilitate dissociating gas mixture from a remote plasma prior to entering into the interior volume 106 for processing. A RF source power 143 is coupled through a matching network 141 to the showerhead assembly 130. The RF source power 143 typically is capable of producing up to about 3000 W at a tunable frequency in a range from about 50 kHz to about 200 MHz.

The showerhead assembly 130 additionally includes a region transmissive to an optical metrology signal. The optically transmissive region or passage 138 is suitable for allowing the optical monitoring system 140 to view the interior volume 106 and/or the substrate 103 positioned on the substrate support pedestal assembly 148. The passage 138 may be a material, an aperture or plurality of apertures formed or disposed in the showerhead assembly 130 that is substantially transmissive to the wavelengths of energy generated by, and reflected back to, the optical monitoring system 140. In one embodiment, the passage 138 includes a window 142 to prevent gas leakage through the passage 138. The window 142 may be a sapphire plate, quartz plate or other suitable material. The window 142 may alternatively be disposed in the lid 104.

In one implementation, the showerhead assembly 130 is configured with a plurality of zones that allow for separate control of gas flowing into the interior volume 106 of the processing chamber 100. In the example illustrated in FIG. 1, the showerhead assembly 130 as an inner zone 134 and an outer zone 136 that are separately coupled to the gas panel 158 through separate inlet ports 132', 132".

The substrate support pedestal assembly 148 is disposed in the interior volume 106 of the processing chamber 100 below the gas distribution (showerhead) assembly 130. The substrate support pedestal assembly 148 holds the substrate 103 during processing. The substrate support pedestal assembly 148 generally includes a plurality of lift pins (not shown) disposed therethrough that are configured to lift the substrate 103 from the substrate support pedestal assembly 148 and facilitate exchange of the substrate 103 with a robot (not shown) in a conventional manner. An inner liner 118 may closely circumscribe the periphery of the substrate support pedestal assembly 148.

In one implementation, the substrate support pedestal assembly 148 includes a mounting plate 162, a base 164 and an electrostatic chuck 166. The mounting plate 162 is coupled to the bottom 110 of the chamber body 102 includes passages for routing utilities, such as fluids, power lines and sensor leads, among others, to the base 164 and the electrostatic chuck 166. The electrostatic chuck 166 comprises at least one clamping electrode 180 for retaining the substrate 103 below showerhead assembly 130. The electrostatic chuck 166 is driven by a chucking power source 182 to develop an electrostatic force that holds the substrate 103 to the chuck surface, as is conventionally known. Alternatively, the substrate 103 may be retained to the substrate support pedestal assembly 148 by clamping, vacuum or gravity.

At least one of the base 164 or electrostatic chuck 166 may include at least one optional embedded heater 176, at least one optional embedded isolator 174 and a plurality of conduits 168, 170 to control the lateral temperature profile of the substrate support pedestal assembly 148. The conduits 168, 170 are fluidly coupled to a fluid source 172 that circulates a temperature regulating fluid therethrough. The heater 176 is regulated by a power source 178. The conduits 168, 170 and heater 176 are utilized to control the temperature of the base 164, thereby heating and/or cooling the electrostatic chuck 166 and ultimately, the temperature profile of the substrate 103 disposed thereon. The temperature of the electrostatic chuck 166 and the base 164 may be monitored using a plurality of temperature sensors 190, 192. The electrostatic chuck 166 may further comprise a plurality of gas passages (not shown), such as grooves, that are formed in a substrate supporting surface of the electrostatic chuck 166 and fluidly coupled to a source of a heat transfer (or backside) gas, such as He. In operation, the backside gas is provided at controlled pressure into the gas passages to enhance the heat transfer between the electrostatic chuck 166 and the substrate 103.

In one implementation, the substrate support pedestal assembly 148 is configured as a cathode and includes an electrode 180 that is coupled to a plurality of RF power bias sources 184, 186. The RF bias power sources 184, 286 are coupled between the electrode 180 disposed in the substrate support pedestal assembly 148 and another electrode, such as the showerhead assembly 130 or ceiling (lid 104) of the chamber body 102. The RF bias power excites and sustains a plasma discharge formed from the gases disposed in the processing region of the chamber body 102.

In the example depicted in FIG. 1, the dual RF bias power sources 184, 186 are coupled to the electrode 180 disposed in the substrate support pedestal assembly 148 through a matching circuit 188. The signal generated by the RF bias power sources 184, 186 is delivered through matching circuit 188 to the substrate support pedestal assembly 148 through a single feed to ionize the gas mixture provided in the plasma processing chamber 100, thereby providing ion energy necessary for performing a deposition or other plasma enhanced process. The RF bias power sources 184, 186 are generally capable of producing an RF signal having a frequency of from about 50 kHz to about 200 MHz and a power between about 0 Watts and about 5000 Watts. An additional bias power source 189 may be coupled to the electrode 180 to control the characteristics of the plasma.

During operation, the substrate 103 is disposed on the substrate support pedestal assembly 148 in the plasma processing chamber 100. A process gas and/or gas mixture is introduced into the chamber body 102 through the showerhead assembly 130 from the gas panel 158. A vacuum pump system 128 maintains the pressure inside the chamber body 102 while removing deposition by-products.

A controller 150 is coupled to the processing chamber 100 to control operation of the processing chamber 100. The controller 150 includes a central processing unit (CPU) 152, a memory 154, and a support circuit 156 utilized to control the process sequence and regulate the gas flows from the gas panel 158. The CPU 152 may be any form of general purpose computer processor that may be used in an industrial setting. The software routines can be stored in the memory 154, such as random access memory, read only memory, floppy, or hard disk drive, or other form of digital storage. The support circuit 156 is conventionally coupled to the CPU 152 and may include cache, clock circuits, input/output systems, power supplies, and the like. Bi-directional communications between the controller 150 and the various components of the processing chamber 200 are handled through numerous signal cables.

Figure 2:
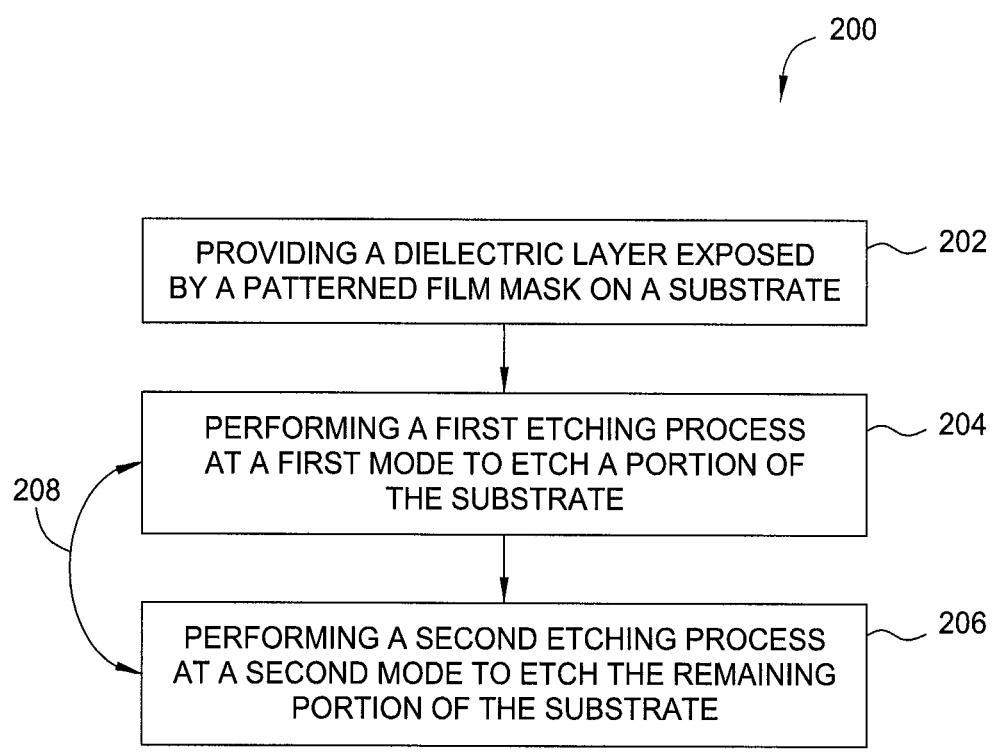
FIG. 2 depicts a flow diagram for performing a spacer layer patterning process.

FIG. 2 illustrates a flow diagram of a method 200 for etching a dielectric layer disposed on a substrate. FIGS. 3A-4D are cross-sectional views of a portion of a substrate 304 with corresponding to various stages of the method 200. The method 200 may be utilized to form high aspect ratio features, e.g., greater than 100:1, for structures, such as a contact structure, gate structure, NAND structure or interconnection structure for logic or memory devices as needed. Alternatively, the method 200 may be beneficially utilized to etch other types of structures.

The method 200 begins at operation 202 by transferring (i.e., providing) a substrate 304 to an etch process chamber, such as the etch chamber 100 depicted in FIG. 1. In the embodiment depicted in FIG. 3A, the substrate 304 has a film stack 302 having a patterned mask layer 312 and a dielectric anti-reflective coating layer 310 (a DARC layer) disposed on a dielectric layer 308. An optional structure 306 (shown by the dotted line 305) may be formed on the substrate 304 when needed. The optional structure 306 may include composite film layers, including pairs of alternating silicon oxide layer and silicon nitride layers (ONON structure) or pairs of alternating silicon oxide layer and polysilicon layers (OPOP structure). It is noted that the optional structure 306 may be any suitable structures, including a single layer, multiple layers or any other configurations as needed.

The patterned mask layer 312 and the patterned DARC layer 310 define openings 314 that expose a surface 316 of the underlying dielectric layer 308 for etching. The substrate 304 may be any one of semiconductor substrates, silicon wafers, glass substrates and the like. The substrate 304 may be a material such as crystalline silicon (e.g., Si<100> or Si<111>), silicon oxide, strained silicon, silicon germanium, germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The substrate 304 may have various dimensions, such as 200 mm, 300 mm, 450 mm or other diameter, as well as, being a rectangular or square panel. Unless otherwise noted, examples described herein are conducted on substrates with a 200 mm diameter, a 300 mm diameter, or a 450 mm diameter substrate.

In one embodiment, the patterned mask layer 312 may be a hard mask, a photoresist mask or a combination thereof. The patterned mask layer 312 along with the patterned DARC layer 310 are used as an etch mask to etch features in the dielectric layer 308 with desired aspect ratios. The features described herein may include trenches, vias, openings and the like. In one embodiment, the patterned mask layer 312 may be a material selected from a group consisting of silicon, silicon oxide, silicon nitride, silicon oxynitride, silicon carbide, amorphous carbon, and combinations thereof. In an exemplary embodiment depicted herein, the mask layer 312 is an amorphous carbon layer. One example of the amorphous carbon layer may be an Advanced Patterning Film™ (APF) available from Applied Materials, Inc. The DARC layer 310 may be a dielectric layer, such as silicon containing material including SiON, SiN, $SiO_2$, Si, or composite layers including SiON or SiN, or $SiO_2$, or any suitable materials as needed.

The dielectric layer 308 may be a dielectric material. Suitable exemplary materials for the dielectric layer include undoped silicon glass (USG), such as silicon oxide or TEOS, boron-silicate glass (BSG), phosphorus-silicate glass (PSG), boron-phosphorus-silicate glass (BPSG), high-k material, low dielectric constant insulating materials (e.g., dielectric constants less than about 4.0) and combinations thereof. Examples of low dielectric constant insulating materials include silicate glass, fluorosilicate glass (FSG), and carbon doped silicon oxide (SiOC), silicon carbide (SiC) and nitrogen containing silicon carbide (SiCN), among others. In an exemplary embodiment depicted herein, the dielectric layer 308 is an undoped silicon glass (USG) layer. Suitable examples of the high-k material layer include hafnium dioxide ($HfO_2$), zirconium dioxide ($ZrO_2$), hafnium silicon oxide ($HfSiO_2$), hafnium aluminum oxide (HfAlO), zirconium silicon oxide ($ZrSiO_2$), tantalum dioxide ($TaO_2$), aluminum oxide, aluminum doped hafnium dioxide, bismuth strontium titanium (BST), and platinum zirconium titanium (PZT), among others. In one embodiment, the dielectric layer 308 has a thickness between about 3000 Å to about 15000 Å, such as between about 4000 Å to about 12000 Å, for example about 10000 Å.

In the embodiment depicted in FIG. 3A, the dielectric layer 308 is a silicon oxide layer having a thickness between about 10 nm and about 10,000 nm. The patterned mask layer 312 is an amorphous carbon layer and the patterned DARC layer 310 is a SiON layer.

At operation 204, an etching process with a first mode is performed to etch the dielectric layer 308 as well as forming a passivation protection 336 while etching. The first mode of the etching process is performed to etch the dielectric layer 308 from the surface 316 (shown in FIG. 3A), forming a feature 326 with a bottom surface 318 exposed in the feature 326, as shown in FIG. 3B1, while forming the passivation protection 336 at certain portions, such as corners 330, top surface 332 and sidewall 320, 322 of the patterned mask layer 312, DARC layer 310 and the dielectric layer 308 simultaneously. In the enlarged view in the circle 328 in FIG. 3B2, while etching the dielectric layer 308 to form the features 326 therein, the passivation protection 336 may be dominantly formed on the top surface 332, corners 330 of the patterned mask layer 312, sidewalls 320 of the DARC layer 310 and sidewalls 322 of the dielectric layer 308. It is believed that with controlled trajectory and directionality of the ions from the plasma generated during the first mode of the etching process, a controlled etching behavior as well as a passivation protection contribution may be obtained so as to efficiently etch the dielectric layer 308 in a manner that would yield a desired resultant film profile.

In one embodiment, the first mode of the etching process as performed during operation 204 may predominately form the passivation protection 336 on particularly sidewalls 322, 320 of the dielectric layer 308 and the DARC layer 310, and some on the corners 330 and top surface 332 of the patterned mask layer 312, as shown in FIG. 3B2. As a result, the active etching species from the plasma may selectively etch only certain portions, e.g., the bottom surface 318, of the dielectric layer 308, without significantly attacking, eroding, or damaging other portions, e.g., the corner 330 and sidewall 320, 322 of the patterned mask layer 312 and the DARC layer 310, and the dielectric layer 308, so as to obtain a good profile of the dielectric layer 308 after the etching process in the first mode at operation 204.

However, as the etching process progresses, the likelihood of damage to the corners 330 and sidewall 320 of the patterned mask layer 312 and the DARC layer 310 increases. For example, the thickness of the passivation protection 336 at the corner 330 of the patterned mask layer 312 may become thinner than the thickness of the passivation protection 336 on the sidewall 322 of the dielectric layer 308 as the etching process progresses (e.g., the passivation protection 336 formed on the sidewall 322 of the dielectric layer 308 is thicker than the passivation protection 336 remaining on the corners 330 in FIG. 3B2), resulting in early collapse or deformation of the patterned mask layer 312 or DARC layer 310. Early collapse or deformation of the patterned mask layer 312 or DARC layer 310 may result in incomplete profile or structure transfer to the features 326 formed in the dielectric layer 308, and eventually leading to device failure. Thus, a second mode of the etching process may be then performed at operation 206, which will be described later below, continuing etching of the features 326 in the dielectric layer 308 without early deformation or collapse of the patterned mask layer 312 or DARC layer 310

In one example, the first mode of the etching process may be performed by supplying an etching gas mixture including one halogen containing gas and at least one silicon containing gas. The halogen containing gas that may be supplied in the gas mixture may be a fluorine containing gas, a chlorine containing gas, or a bromide containing gas. Suitable examples of the halogen containing gas include $CHF_3$, $CH_2F_2$, $CF_4$, $C_2F$, $C_4F_6$, $C_3F_8$, HCl, $C_4F_8$, $Cl_2$, $CCl_4$, $CHCl_3$, $CHF_3$, $C_2F_6$, $CH_2Cl_2$, $CH_3Cl$, $SF_6$, $SiCl_4$, $Si_2Cl_6$, $NF_3$, HBr, $Br_2$ and the like. Particularly, examples of the chlorine containing gas include HCl, $Cl_2$, $CCl_4$, $CHCl_3$, $CH_2Cl_2$, $CH_3Cl$, $SiCl_4$, $Si_2Cl_6$, and the like, and examples of the bromide containing gas include HBr, $Br_2$ and the like. Suitable examples of the silicon containing gas include $SiCl_4$, $Si_2Cl_6$, $SiH_4$, $Si_2H_6$, and the like. A reacting gas, such as $O_2$, $N_2$, $N_2O$, $NO_2$, $O_3$, $H_2O$, or the like may also be supplied in the etching gas mixture as needed. In one particularly example, the halogen containing gas used in the etching gas mixture is $NF_3$ and the silicon containing gas used in the etching gas mixture include $SiCl_4$ and the reacting gas is $O_2$.

While supplying the etching gas mixture into the processing chamber, an inert gas may be optionally supplied into the etching gas mixture to assist the profile control as needed.

Examples of the inert gas supplied in the gas mixture include Ar, He, Ne, Kr, Xe or the like.

The first mode of the etching process may be continuously performed until the passivation protection 336 formed on the features 326 is substantially consumed and needed to be replenished for further etching. Although the feature etching process and the passivation protection formation occur simultaneously, the etching rate is controlled to be slightly greater that the passivation protection formation rate so as to ensure the feature etching process can progress and continuously be performed until the passivation protection 336 needed to be replenished.

During the first mode of the etching process at operation 204, the etching process may be performed in an etching reactor, such as the plasma processing chamber 100 depicted in FIG. 1. While performing the first mode of the etching process in the processing chamber 100, the chamber pressure of the etching gas mixture is also regulated. In one exemplary embodiment, a process pressure in the plasma processing chamber is regulated between about 2 mTorr to about 100 mTorr, for example, at about 5 mTorr and 20 Torr. RF source power may be applied to maintain a plasma formed from the first mode of the etching gas mixture. For example, a RF source power with a frequency of about 13.56 MHz may be applied at an energy level of between about 200 Watts to about 1000 Watts, such as about 750 Watts, to an inductively coupled antenna source to maintain a plasma inside the etch chamber. In addition, a RF bias power, with a frequency of between about 2 MHz and about 13.56 MHz, may be applied less than 500 Watts, such as between about 200 Watts to about 450 Watts, such as about 390 Watts. A substrate temperature is maintained between about −10 degrees Celsius to about 60 degrees Celsius.

In one example of the first mode, the $O_2$ gas may be supplied into the chamber at a rate between about 50 sccm to about 500 sccm, such as between about 80 sccm and about 150 sccm. The halogen-containing gas, $NF_3$, may be supplied at a flow rate between about 20 sccm and about 100 sccm, such as between about 40 sccm and about 80 sccm. The silicon containing gas, $SiCl_4$, may be supplied at a flow rate between about 10 sccm and about 100 sccm, such as between about 10 sccm and about 30 sccm.

Alternatively, the $SiCl_4$ gas and the $NF_3$ gas may be supplied in the first mode at a flow ratio (i.e., $SiCl_4:NF_3$) by volume of between about 1:1 and about 1:10, such as between about 1:2 and about 1:8. The $SiCl_4$ gas and the $O_2$ gas may be supplied at a flow ratio (i.e., $SiCl_4:O_2$) by volume of between about 1:2 and about 1:15, such as between about 1:3 and about 1:7.

In one example, between about 1% and about 5% the dielectric layer 308 is etched away in the first mode of the etching process at operation 204. The first mode of the etching process at operation 204 may be performed by time mode for a time period between about 10 seconds and about 10 seconds.

At operation 206, the first mode of the etching process is switched to a second mode of the etching process to repair and replenish the passivation protection 336 formed in the features 326, as shown in FIG. 3C. Just prior to the second mode stage, the patterned mask layer 312 may already be consumed and etched away from the substrate 304. The second mode of the etching process is subsequently performed to form and repair the loose/damaged passivation protection 336 on the sidewall 320 of the DARC layer 310 and the corners 330 of the patterned mask layer 312 so as to ensure the features 326 may be further etched down until a high aspect ratio structure is formed. In order to ensure the features 326 are not undesirably damaged or etched during the passivation protection replenish/repair process, the second mode of the etching process at operation 206 is configured to be a dominantly passivation protection formation process, e.g., substantially seizing the etching process, until a sufficient thickness of the passivation protection 336 is formed on the features 326. Thus, after the second mode of the etching process, the passivation protection 336 is widely and globally formed and replenished on the entire surface of the features 326, including the top surface 332, sidewall 320, 322 and bottom 318 of the dielectric layer 308, to be ready for further etching through the bottom surface 318 exposed by the first mode of the etching process at operation 204.

During the second mode of the etching process, the etching gas mixture is maintained substantially with the same gas species, except the ratio of the gas species supplied in the etching gas mixture is changed as well as some of the process parameters. For example, the silicon containing gas, the reacting gas and the halogen containing gas ($SiCl_4$, $O_2$ and $NF_3$) supplied in the first mode of the etching process is continuously supplied in the second mode but with different ratios among these three gases. Additionally, the process pressure as well as the RF source and bias power range, may be changed to control the sidewall/bottom/corner passivation protection 336.

In one example, the $O_2$ gas flow rate supplied during the second mode is increased as well as the $SiCl_4$ gas flow rate. The higher flow rate of the $O_2$ gas and $SiCl_4$ gas may promote reaction and formation of the $SiO_x$ layer, forming as the passivation protection 336 on the sidewalls 320, 332, corners 330 and bottom 318. The low amount of the $NF_3$ gas may provide minimum etching species, $F^-$, during the second mode to prevent the features 326 from further etched or damaged while providing reactive $N^*$ to react with the Si and O atoms from the $SiCl_4$ and $O_2$ gas to form $SiN_x$ or $SiO_xN_y$. $SiO_x$, $SiN_x$, and $SiO_xN_y$, all of which are good sources of dielectric by-product that form the desired passivation protection 336 on the sidewalls 320, 332, corners 330 and bottom 318. In one example, the gas flow rate of the $O_2$ gas in the second mode at operation 206 may be about 1.2 times to about 10 times greater than the gas flow rate of the $O_2$ gas provided during the first mode at operation 204. The gas flow rate of the $SiCl_4$ gas in the second mode at operation 206 may be about 1.1 times to about 8 times greater than the gas flow rate of the $SiCl_4$ gas provided during the first mode at operation 204. The gas flow rate of the $NF_3$ gas provided during the second mode at operation 206 may be about the same or less than the gas flow rate of the $NF_3$ gas in the first mode at operation 204.

In one example of the second mode, the $O_2$ gas may be flowed into the chamber at a rate between about 80 sccm to about 800 sccm, such as between about 100 sccm and about 140 sccm. The halogen-containing gas, $NF_3$, may be supplied at a flow rate between about 20 sccm and about 200 sccm, such as between about 40 sccm and about 80 sccm. The silicon containing gas, $SiCl_4$, may be supplied at a flow rate between about 10 sccm and about 200 sccm, such as between about 20 sccm and about 40 sccm.

Alternatively, the $SiCl_4$ gas and the $NF_3$ gas may be supplied during the second mode at a flow ratio (i.e., $SiCl_4:NF_3$) by volume between about 1:1 and about 1:10, such as between about 1:2 and about 1:4. The $SiCl_4$ gas and the $O_2$ gas may be supplied at a flow ratio (i.e., $SiCl_4:O_2$) by volume between about 1:2 and about 1:20, such as between about 1:3 and about 1:7.

Furthermore, the process pressure may also maintained at a higher level during the second mode so as to control the gas flow in a manner that globally and widely distributes the gas mixture across the substrate surface, rather than promoting a specific ion trajectory or directionality that may travel down to the bottom surface 318 and undesirably attacked the features 326 and damage the feature profile. In one example, the process pressure during the second mode is about 0.5 times to 10 times higher than the first mode of the etching process. For example, the pressure in the second mode at operation 206 may be maintained between about 15 mTorr and about 50 mTorr, while the pressure in the first mode at operation 204 may be maintained between about 5 mTorr and about 20 mTorr.

Furthermore, when operating in the second mode, RF source power applied to maintain a plasma formed from the etching gas mixture is greater than or the same as the RF source power provided during the first mode. For example, a RF source power with a frequency of about 13.56 MHz may be applied at an energy level of between about 200 Watts to about 1500 Watts, such as about 750 Watts, to an inductively coupled antenna source to maintain a plasma inside the etch chamber. In addition, a RF bias power, with a frequency of between about 2 MHz and about 13.56 MHz, may be applied in the second mode less than 500 Watts, such as between about 200 Watts to about 450 Watts, such as about 390 Watts, greater than or the same of the RF bias power supplied in the first mode. A substrate temperature is maintained between about −10 degrees Celsius to about 60 degrees Celsius. The second mode of the etching process at operation 206 may be performed by time mode for a time period between about 1 seconds and about 10 seconds.

It is noted that the operation 204 and operation 206 may be repeatedly performed or cycled until a surface 340 the underlying substrate 304 is exposed, as shown in FIG. 3D. By utilizing simultaneous etching/deposition in the first mode and predominating a deposition process in the second mode, the features 338 with high aspect ratio between about 2:1 and about 80:1, such as greater than 10:1, may be etched and shaped in a controlled manner that can provide the desired profile with the desired substantially sharp right angle and upright (e.g., straight, vertical) sidewalls 346, 344 with steep slope and accurate dimensions.

Thus, embodiments of etching a dielectric layer to form features with desired edge/corner profile and desired aspect ratios are provided. By utilizing two different etching modes along the etching process, a controlled ion trajectory/directionality as well as sidewall/corner passivation protection may be obtained so as to etch the dielectric layer in a desired manner that yields features in the dielectric layer with desired accurate and right angle corners and vertical sidewall profile as well as feature aspect ratios.

While the foregoing is directed to embodiments of the present invention, other and further embodiments of the invention may be devised without departing from the basic scope thereof, and the scope thereof is determined by the claims that follow:

What is claimed is:

1. A method for etching a dielectric layer to form features in the dielectric layer, comprising:
   (a) supplying an etching gas mixture in a first mode to etch a portion of a dielectric layer disposed on a substrate while forming a passivation protection in the dielectric layer, wherein the dielectric layer is etched through openings defined in a patterned mask layer disposed on the dielectric layer;
   (b) supplying the etching gas mixture in a second mode to continue forming the passivation protection in the dielectric layer without etching the dielectric layer, wherein the etching gas mixture include at least a silicon containing gas and a flow rate of the silicon containing gas supplied in the second mode is greater than a flow rate of the silicon containing gas supplied in the first mode; and
   (c) repeatedly performing (a) and (b) to form features in the dielectric layer until a surface of the substrate is exposed.

2. The method of claim 1, wherein the dielectric layer is a $SiO_2$ layer.

3. The method of claim 1, wherein the etching gas mixture further includes a halogen containing gas and a reacting gas.

4. The method of claim 3, wherein the silicon containing gas is $SiCl_4$, and halogen containing gas $NF_3$ and the reacting gas is $O_2$.

5. The method of claim 3, wherein a flow rate of the reacting gas supplied in the second mode is greater than a flow rate of the reacting gas supplied in the first mode.

6. The method of claim 3, wherein a flow rate of the halogen containing gas supplied in the second mode is substantially the same or less than a flow rate of the halogen containing gas supplied in the first mode.

7. The method of claim 1, wherein a process pressure during the first mode is less than a process pressure during the second mode.

8. The method of claim 1, wherein (b) supplying the etching gas mixture in the second mode further comprises:
   repairing the passivation protection formed on corners and sidewalls of the features formed in the dielectric layer.

9. The method of claim 1, wherein (b) supplying the etching gas mixture in the second mode further comprises:
   forming the passivation protection formed on bottom surfaces of the features formed in the dielectric layer to prevent the features from etching.

10. The method of claim 1, wherein (a) supplying the etching gas mixture in the first mode further comprises:
    predominantly forming a passivation protection on corners and sidewalls of the features formed in the dielectric layer.

11. The method of claim 1, wherein (a) supplying the etching gas mixture in the first mode further comprises:
    etching the dielectric layer at an etching rate greater than the passivation protection formation rate to form the passivation protection on the features.

12. The method of claim 1, wherein the passivation protection is formed from a material selected from the group consisting of $SiO_2$, SiON and SiN.

13. The method of claim 1, wherein a RF source power and a RF bias power energize the etching gas mixture during the first and the second modes to form a plasma from the etching gas mixture.

14. The method of claim 13, wherein the RF source power applied during the second mode is greater than the RF source power applied during the first mode.

15. The method of claim 13, wherein the RF bias power applied in the second mode is greater than the RF bias power in the first mode.

16. A method for etching a dielectric layer to form features in the dielectric layer, comprising:
    (a) performing a plasma process to etch a dielectric layer disposed on a substrate in a first mode to form features in the dielectric layer while forming a passivation protection predominately on corners and sidewalls of the features formed in the dielectric layer; and
    (b) continuously performing the plasma process in a second mode to dominantly form the passivation protection on the corners, sidewalls and bottom of the features formed in the dielectric layer without etching the dielectric layer, wherein a process pressure in the first mode is less than a process pressure in the second mode.

17. The method of claim 16, further comprising:
repeating (a) and (b) until a surface of the substrate is exposed.

18. The method of claim 16, wherein a flow rate of a reacting gas and a silicon containing gas included in the plasma process during the first mode is supplied at a greater flow rate than a flow rate of the reacting gas and the silicon containing gas provided during the second mode.

19. A method for etching a dielectric layer to form features in the dielectric layer, comprising:
  (a) performing a plasma process to etch a dielectric layer disposed on a substrate in a first mode to form features in the dielectric layer while forming a passivation protection predominately on corners and sidewalls of the features in the dielectric layer;
  (b) continuously performing the plasma process in a second mode to dominantly form the passivation protection on the corners, sidewalls and bottom of the features in the dielectric layer without etching the dielectric layer, a reacting gas and a silicon containing gas included in the plasma process in the first mode supplied at a greater flow rate than the reacting gas and the silicon containing gas in the second mode, wherein a process pressure in the first mode is less than a process pressure in the second mode; and
  (c) repeating (a) and (b) until a surface of the substrate is exposed.

* * * * *